(12) United States Patent
Kawachi

(10) Patent No.: US 7,960,916 B2
(45) Date of Patent: Jun. 14, 2011

(54) DISPLAY DEVICE AND ELECTRONIC DEVICE USING THIN-FILM TRANSISTORS FORMED ON SEMICONDUCTOR THIN FILMS WHICH ARE CRYSTALLIZED ON INSULATING SUBSTRATES

(75) Inventor: Genshiro Kawachi, Chiba (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 489 days.

(21) Appl. No.: 12/122,265

(22) Filed: May 16, 2008

(65) Prior Publication Data
US 2008/0283843 A1    Nov. 20, 2008

(30) Foreign Application Priority Data

May 16, 2007 (JP) .................................. 2007-130923
Apr. 4, 2008 (JP) .................................. 2008-098605

(51) Int. Cl.
*H01Q 1/26* (2006.01)
(52) U.S. Cl. ................. 315/34; 257/59; 257/72; 257/88
(58) Field of Classification Search .............. 257/59, 257/72, 88; 315/34
See application file for complete search history.

(56) References Cited

U.S. PATENT DOCUMENTS

| 7,247,357 B2 * | 7/2007 | Shiba et al. | 428/1.51 |
| 2001/0025960 A1 * | 10/2001 | Ohtani et al. | 257/72 |
| 2007/0080905 A1 * | 4/2007 | Takahara | 345/76 |

FOREIGN PATENT DOCUMENTS

| JP | 2001-330860 | 11/2001 |
| JP | 2006-302267 | 11/2006 |

OTHER PUBLICATIONS

R.R.J. Vanoppen et al, "The high-frequency analogue performance of MOSFETs", IEDM 94, 1994, pp. 173-176.

* cited by examiner

*Primary Examiner* — Kenneth A Parker
*Assistant Examiner* — Anthony Ho
(74) *Attorney, Agent, or Firm* — Oblon, Spivak, McClelland, Maier & Neustadt, L.L.P.

(57) ABSTRACT

A method of receiving video data, a control signal, etc. via a non-contact transmission path is adopted, and a receiving circuit for receiving and amplifying a signal is formed on the same insulating substrate as a display device. Thus, there are provided a thin-film transistor which is formed in a semiconductor thin film that is formed on the insulating substrate and crystallized in a predetermined direction, and an inductor for forming an inductive-coupling circuit, which is formed by using an electrically conductive thin film provided on the insulating substrate. The direction of movement of carriers flowing in the thin-film transistor is parallel to the direction of crystallization of the semiconductor thin film, and the inductor and the thin-film transistor are integrated so as to be electrically coupled directly or indirectly.

9 Claims, 14 Drawing Sheets

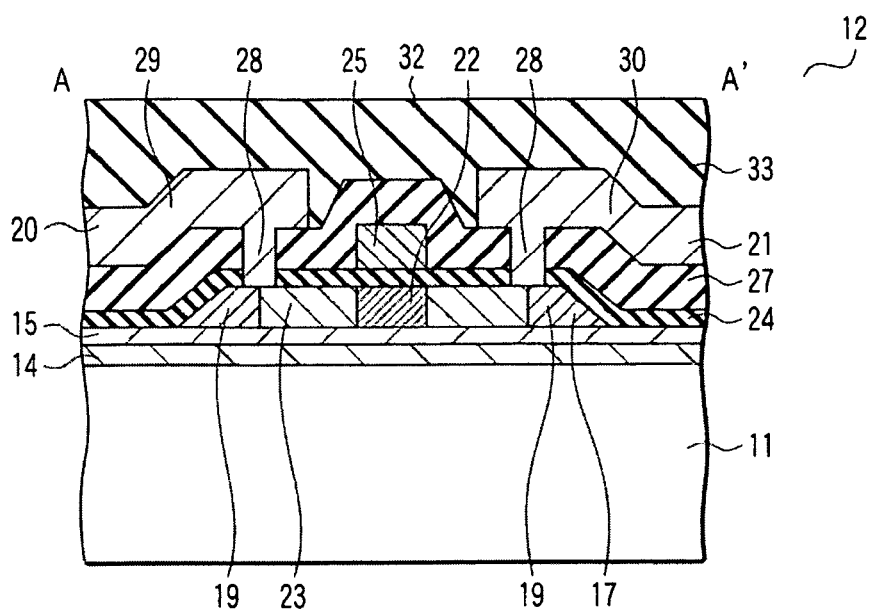
F I G. 2
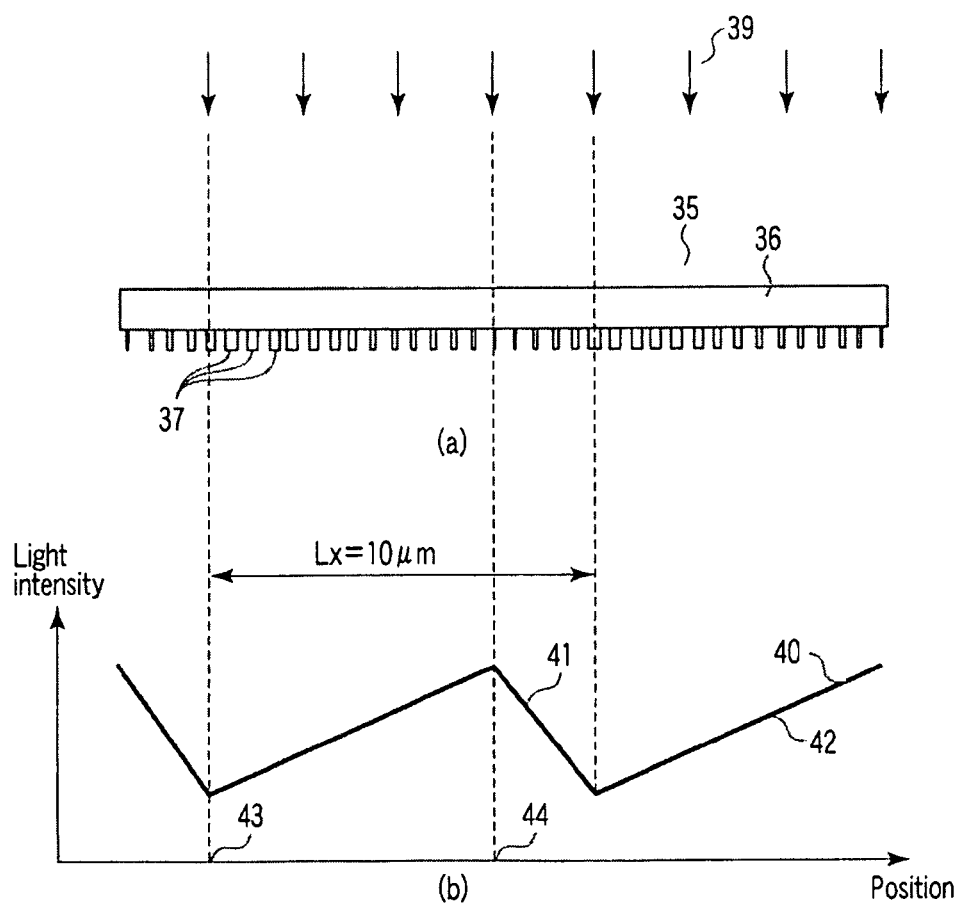
F I G. 4

(a) $f_T$ (b) $f_{max}$

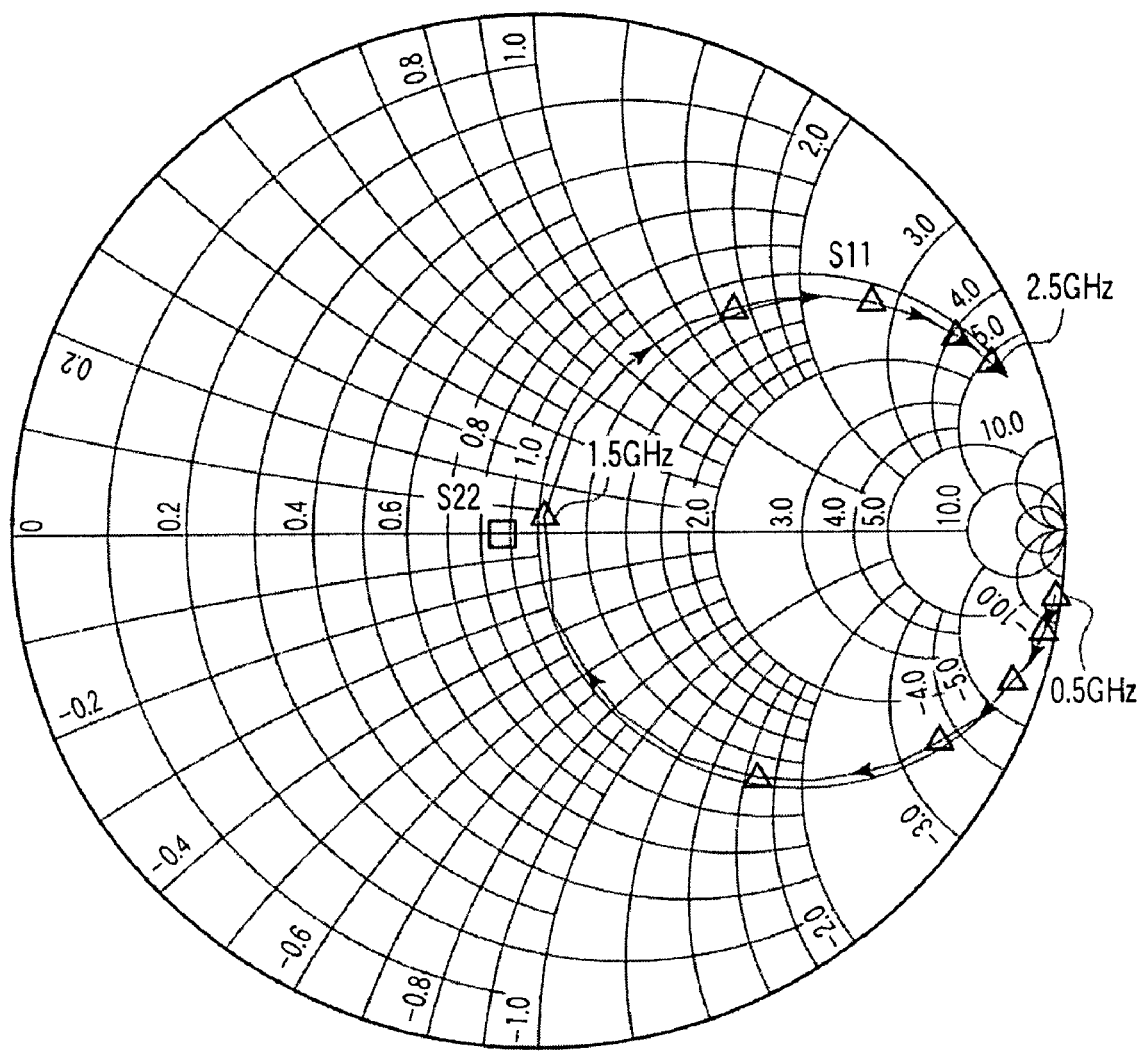
F I G. 22

DISPLAY DEVICE AND ELECTRONIC DEVICE USING THIN-FILM TRANSISTORS FORMED ON SEMICONDUCTOR THIN FILMS WHICH ARE CRYSTALLIZED ON INSULATING SUBSTRATES

CROSS-REFERENCE TO RELATED APPLICATIONS

This application is based upon and claims the benefit of priority from prior Japanese Patent Applications No. 2007-130923, filed May 16, 2007; and No. 2008-098605, filed Apr. 4, 2008, the entire contents of both of which are incorporated herein by reference.

BACKGROUND OF THE INVENTION

1. Field of the Invention

The present invention relates to a thin-film transistor formed on a semiconductor thin film which is deposited on an insulating substrate and is crystallized in a predetermined direction, and to an electronic device and a display device which are fabricated by using the thin-film transistors. In particular, the invention relates to an electronic device and a display device, which employ thin-film transistors having channel regions formed in regions that are crystal-grown in a lateral direction, and which are suitably applied to analog circuits which perform signal processing of 1 GHz or more.

2. Description of the Related Art

As a display device of, e.g. OA equipment, which displays image information and text information, there is known an active-matrix flat-panel display which uses thin-film transistors. In recent years, with the development of multimedia communication technology, attention has been paid to an integrated-function type display as a next-generation display, which is called a "system-on-panel" display. This integrated-function type display is designed for personal use, has a small size and light weight, and has a high resolution and a high image quality. Moreover, peripheral functions relating to image display, such as driver circuits, memory circuits, DA converters and image processing circuits, are integrated on a display panel.

In the structure of a conventional display device, for example, in the case of a desktop computer, a system device and a display device need to be connected by a dedicated shield cable to which an unwanted radiation (electromagnetic interference) measure is applied. Alternatively, in the case of a notebook computer, a display and a system are integrated and are connected by a short flexible cable. In other words, in the prior art, the transmission path between the system and the display is designed as a path having a sufficient transmission speed for transmitting image data that is to be displayed. Thus, in order to cause a display to display an image, there is no choice but to dispose the system device in the vicinity of the display.

However, the conventional display device is not suited to the ubiquitous society which is expected to come in the future and realize "anytime, anywhere" networking.

As regards an electronic device, such as a mobile phone, which needs to be reduced in size, there is a problem that the mounting of components in the device is restricted by a flexible cable that is connected to the display.

BRIEF SUMMARY OF THE INVENTION

In order to achieve the object of the invention, the embodiments of the invention may adopt the following means.

(i) In an electronic device and a display device which are constituted by using thin-film transistors which are formed on an insulating substrate such as a glass substrate or a plastic substrate, a method of receiving video data, a control signal, etc. via a non-contact transmission path is adopted, and a receiving circuit for receiving and amplifying an electromagnetic signal is formed on the same insulating substrate as a display device. In particular, the thin-film transistor is formed in a semiconductor thin film that is crystallized in a predetermined direction. The direction of movement of carriers, such as electrons and holes, flowing in the thin-film transistor is set to agree with the direction of crystallization. Since it is desirable that crystal grain boundaries occurring in the crystallized semiconductor thin film be in parallel to the direction of carriers, the direction of growth of the semiconductor thin film may be either direction if the direction of growth is parallel to the direction of movement of carriers in the thin film transistor.

(ii) An inductive-coupling circuit using inductance is used as the above-described non-contact transmission path.

(iii) The above-described receiving circuit was formed by using a thin-film transistor formed on an insulating substrate such as a glass substrate or a plastic substrate. A thin-film transistor having a maximum oscillation frequency of 10 GHz or more is used as the above-described thin-film transistor. The thin-film transistor can be obtained by using a semiconductor thin film which is crystallized in a predetermined direction, and setting the direction of movement of carriers, such as electrons and holes, flowing in the thin-film transistor to agree with the direction of crystallization.

(iv) An inductor element, which is used in the above-described receiving circuit, is formed integral with the above-described thin-film transistor on the insulating substrate, such as a glass substrate or a plastic substrate, by using a wiring material for forming the thin-film transistor.

For example, a signal amplifying circuit, which processes a received high-frequency signal, processes, in general, a received analog signal by using a band-pass filter, a low-noise amplifier (LNA), an image removal filter, a local oscillator, a mixer, a low-pass filter and a sample & hold circuit, and outputs the processed signal as a digital signal (see FIG. 16). In an ordinary signal processing device, frequencies which are received by an antenna are 1 GHz to 5 GHz. In the analog signal processing circuit, it is preferable to use a thin-film transistor which has a cutoff frequency on the order of GHz and has a maximum oscillation frequency exceeding 10 GHz. It was understood that the high-frequency performance was achieved by using a semiconductor thin film which is crystallized in a predetermined direction. Thus, the thin-film transistor should preferably have a channel region which is formed in a laterally crystal-grown region, and in particular the thin-film transistor should preferably have a channel region in a laterally grown crystal.

An invention described in the embodiment having the above-described features relates to a display device comprising: a thin-film transistor which is formed in a semiconductor thin film which is formed on an insulating substrate and crystallized in a predetermined direction; an antenna which is formed by using a metal wiring film provided on the insulating substrate; an electromagnetic wave receiving circuit which uses a plurality of the thin-film transistors and is formed of all or at least one of an amplifying circuit, a frequency mixing circuit and an oscillation circuit, which are constituted by selectively integrating an inductor which is formed by using a metal wiring film, and a resistor; a digital signal processing circuit which is constituted by using a plurality of the thin-film transistors; scanning lines and signal lines which connect a plurality of the thin-film transistors which are arrayed in a matrix; and an active matrix which is composed of pixel electrodes which are connected to the respective thin-film transistors.

An invention described in the embodiment having the above-described features relates to a display device comprising: a thin-film transistor which is formed in a semiconductor thin film which is formed on an insulating substrate and crystallized in a predetermined direction; an inductor for forming an inductive-coupling circuit, which is formed by using an electrically conductive thin film provided on the insulating substrate; an electromagnetic wave receiving circuit which uses a plurality of the thin-film transistors and is formed of all or at least one of an amplifying circuit, a frequency mixing circuit and an oscillation circuit, which are constituted by selectively integrating an inductor which is formed by using a metal wiring film, and a resistor; a digital signal processing circuit which is constituted by using a plurality of the thin-film transistors; and an active matrix which is composed of a plurality of the thin-film transistors which are arrayed in a matrix, scanning lines and signal lines which connect the thin-film transistors, and pixel electrodes which are connected to the respective thin-film transistors.

An invention described in the embodiment having the above-described features relates to an electronic device formed on an insulating substrate, comprising at least one of an amplifying circuit, a frequency mixing circuit and an oscillation circuit, which are constituted by selectively integrating: a thin-film transistor which is formed in a semiconductor thin film which is formed on an insulating substrate and crystallized in a predetermined direction; an antenna which is formed by using a metal wiring film which is at least provided on the insulating substrate; and an inductor which is formed by using a metal wiring film provided on the insulating substrate, and a resistor.

It was understood that in the thin-film transistor provided on the insulating substrate, high-frequency characteristics of GHz or more can be obtained by using a semiconductor thin film that is crystallized in a predetermined direction, and by setting the direction of carriers flowing in the thin-film transistor to accord with the direction of crystallization. Therefore, the formation of an amplifier circuit, etc. for analog signals in a region of GHz or more was made easier.

BRIEF DESCRIPTION OF THE SEVERAL VIEWS OF THE DRAWING

FIG. 2 is a cross-sectional view of the thin-film transistor, taken along line A-A' in FIG. 1;

FIG. 4 includes a cross-sectional view (a) of a phase shifter 35 which is usable in order to form a crystallized Si film, and a schematic graph (b) of a light intensity distribution;

FIG. 22 is a Smith chart showing input/output reflection coefficients S11, S22.

DETAILED DESCRIPTION OF THE INVENTION

Figure 1:
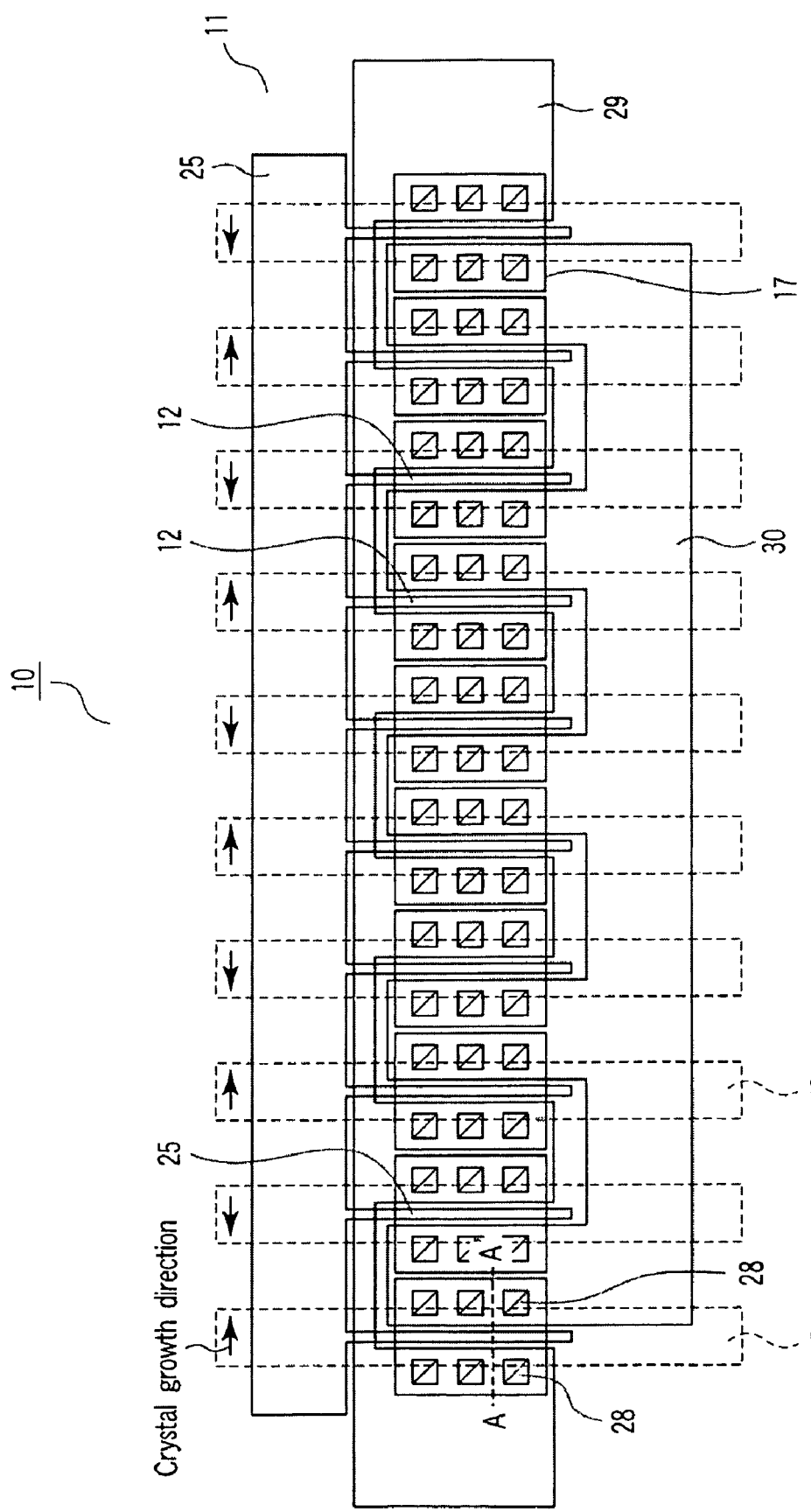
FIG. 1 is a plan view showing thin-film transistors according to the present invention, and specifically showing a plurality of field-effect thin-film transistors which are formed on an insulating substrate and are connected in parallel.

To begin with, a thin-film transistor, which is used in the present invention, is described. FIG. 1 is a plan view of a thin-film transistor circuit 10 with a channel width of 200 microns. In the thin-film transistor circuit 10, ten field-effect thin-film transistors 12 each having a channel width of 20 microns are connected in parallel. The field-effect thin-film transistors 12 are formed on a semiconductor thin film which is recrystallized in a predetermined direction and is formed on an insulating substrate 11 that is a glass substrate in the present embodiment. The insulating substrate 11 is not limited to the glass substrate, and a quarts substrate or a plastic substrate may be used. In a transistor device which drives a large current, good characteristics can be maintained by disposing a plurality of transistors each having a small channel width in parallel. In addition, with this structure, thermal destruction due to self-heat-production of the device at the time of operation with large current can be prevented.

FIG. 2 is a cross-sectional view taken along line A-A' in FIG. 1. The whole structure is formed on an SiNx film 14 with a thickness of 50 nm and a buffer insulation film 15 that is formed of an $SiO_2$ film with a thickness of 100 nm, which are provided on a no-alkali glass substrate 11 that is an insulating substrate. The buffer insulation film 15 functions to prevent diffusion of impurities from the glass substrate 11 and to protect the insulating substrate from high temperatures, for example, in a subsequent crystallizing step or activating step. An island pattern 17 of, e.g. an Si film, which is a semiconductor film with a thickness of 100 nm that constitutes the thin-film transistor 12, is formed on the $SiO_2$ film 15. The island of the Si film is formed in the following manner. A non-single-crystal semiconductor film, for example, an amorphous Si film, is formed the buffer insulation film 15. A layer 23 is crystal-grown in a lateral direction in a crystallizing step using heat treatment by laser beam irradiation (to be described later). The layer 23 is left in an island shape in association with a position where the thin-film transistor 12 is to be formed. The material of the semiconductor film is not limited to Si, and group III-V semiconductors, such as Ge and GaAs, and other semiconductor materials may be used. A source layer 20 and a drain layer 21, which are $n^+$ doped layers 19, are formed within the semiconductor film island 17. A gate electrode 25, which is formed of, e.g. a MoW alloy film, is formed on a channel 22 via a gate insulation film 24 which is formed of $SiO_2$ with a thickness of 30 nm. The gate electrode 25 is formed in a comb shape so as to connect a plurality of transistors in parallel. By forming the gate electrode in this shape, a decrease in maximum oscillation frequency due to the resistance of the gate electrode can be minimized.

A source wiring line 29 and a drain wiring line 30, each of which is formed of, e.g. a three-layer metal film of Ti/Al/Ti, are connected over the Si film island 17 and the gate electrode 25 via contact through-holes 28 provided in an interlayer insulation film 27. A protection insulation film 33, which is formed of $SiO_2$, is formed so as to cover the entire structure.

Figure 3A:
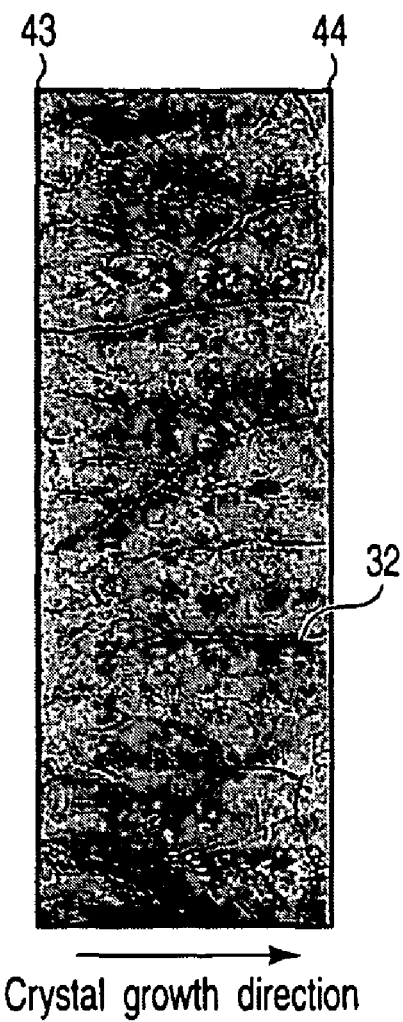
FIG. 3A is a scanning electron microscope image of an Si film which is crystal-grown in a lateral direction.
Figure 3B:
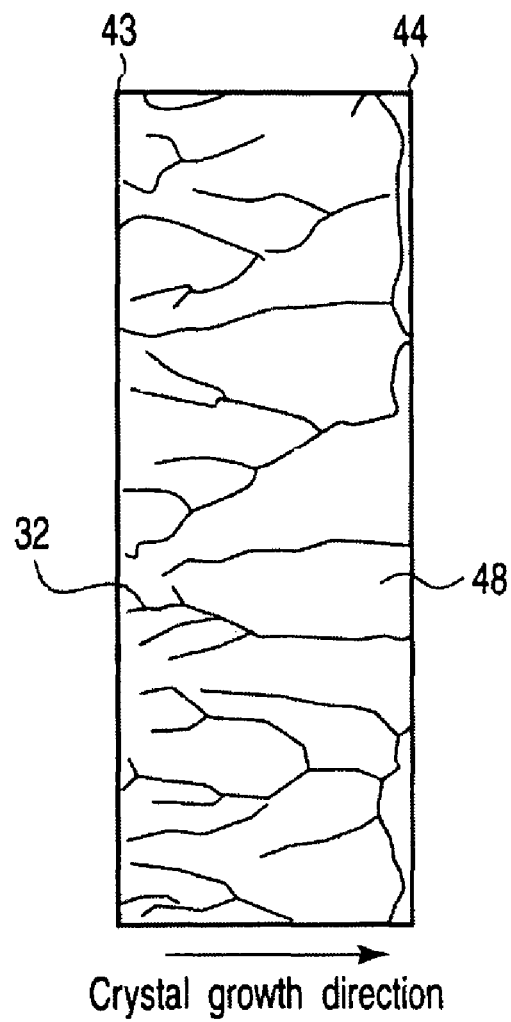
FIG. 3B is a view that schematically shows crystal grain boundaries which have occurred.

FIG. 3A shows a scanning electron microscope image of an Si film which is formed by first providing an amorphous Si film on the buffer insulation film 15 in FIG. 2, subjecting the amorphous Si film to heat treatment by radiating a laser beam with a predetermined light intensity distribution to the amorphous Si film, and crystal-growing the amorphous Si film in a lateral direction in a crystallizing step. It is understood that crystal grain boundaries 32 are formed substantially in parallel to the direction of crystal growth. It is known that if such crystal grain boundaries cross a carrier conduction path, this becomes a factor which hinders carrier conduction. Thus, the channel is formed such that the direction of electric current becomes parallel to the crystal growth direction, that is, the direction of crystal grain boundaries. Thereby, a high carrier mobility can be realized. The cutoff frequency of the thin-film transistor is proportional to the carrier mobility and is a very important factor in the application of high-frequency waves. According to the present embodiment, since the high carrier mobility can be ensured, good high-frequency characteristics can be realized.

FIG. 4 includes a cross-sectional view (a) of a phase shifter 35 which is usable in order to form a crystallized Si film, and a schematic graph (b) of a light intensity distribution. Although the structure of the phase shifter 35 is not limited to the structure shown in FIG. 4, the phase shifter 35 is configured, for example, such that a plurality of projection patterns 37, each of which is formed of $SiO_2$ and has a predetermined size, are formed on a quartz plate 36 and arranged with a predetermined density. A spatially uniformized laser beam 39 is made to pass through the phase shifter 35. Thereby, a light intensity distribution having a comb-shaped repetitive pattern 40 can be formed on the irradiation surface of the multilayer substrate in which the SiNx film 14, $SiO_2$ film 15 and amorphous Si film are successively formed on the insulating substrate 11. In the present embodiment, the pitch Lx of repetition of projection patterns 37 is set at 10 μm, but the pitch Lx can be set at a desired value by design.

The light intensity distribution shown in FIG. 4 includes sawtooth portions formed of a pair of straight portions 41 and 42 with different inclinations. The light intensity distribution is not limited to the sawtooth distribution, and may be an arbitrary light intensity distribution which is suited to crystallization. For example, as in the embodiment shown in FIG. 1, in the case of forming symmetric crystal growth regions 45, 46 with opposed crystal growth directions (see arrows), a symmetric light intensity distribution is adopted.

After the irradiation region of the semiconductor film is melted by the radiation of a laser beam, e.g. an excimer laser beam, the radiation of the pulse laser beam is stopped in a laser turn-off period, and the temperature is lowered. Thereby, the semiconductor film is recrystallized. At this time, melting/recrystallization (crystal growth) occurs, successively while passing coagulation points, from a crystal nucleus, which occurs in a region (low-temperature region) 43 with a low laser beam intensity, toward a region (high-temperature region) 44 with a high laser beam intensity (i.e. from the left to the right in FIG. 3A). As a result, a polycrystalline state occurs in a beginning part of recrystallization, and with the progress of crystal growth in the lateral direction, the size of a crystal grain 48, which has directivity for easy crystallization, gradually increases. Thus, an aggregation of single crystal grains each having a larger size than the gate dimension (channel region) of a thin-film transistor, which is formed subsequently, can be obtained.

Since the crystal growth progresses in the lateral direction from the crystal nucleus that occurs in the region (low-temperature region) 43 with a low laser beam intensity, the crystallized region can be formed in accordance with a predetermined position of formation of the thin-film transistor.

Figure 5:
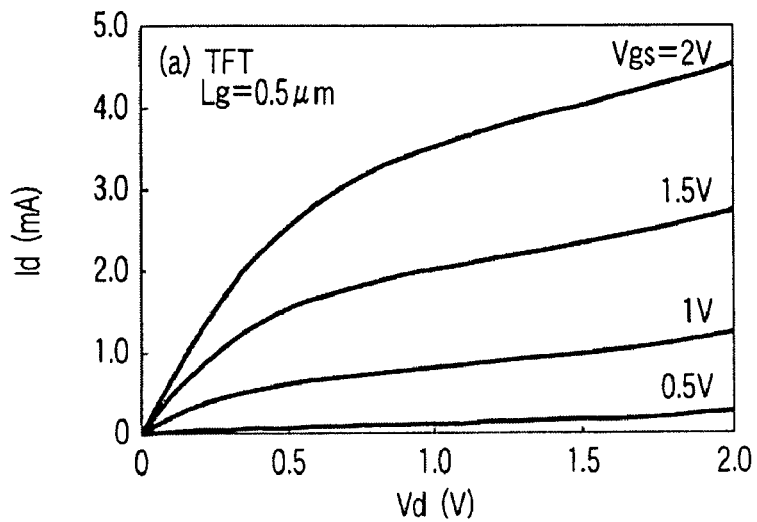
FIG. 5 shows output characteristics of the thin-film transistor according to the present invention.

FIG. 5 shows output characteristics of the thin-film transistor having the structure and dimensions shown in FIG. 1, which is fabricated on the crystalline Si film formed in the above manner. Under the bias condition of the gate voltage (Vgs)=drain voltage (Vds)=2V, an ON current of 4 to 5 mA is obtained.

Figure 6:
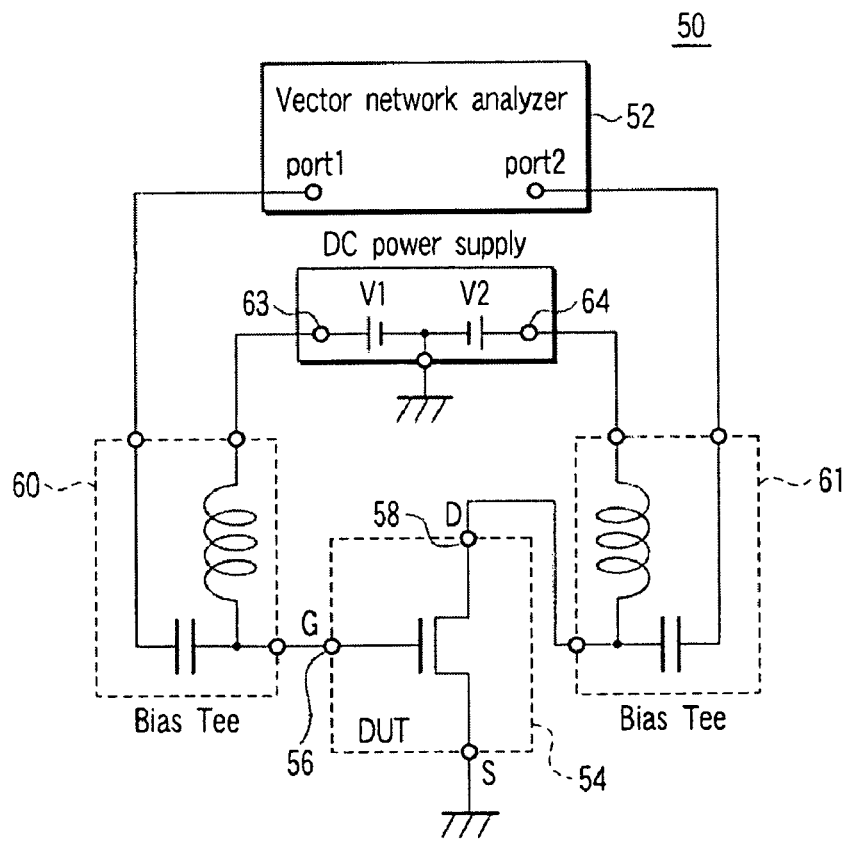
FIG. 6 shows an evaluation system for measuring high-frequency characteristics of the thin-film transistor.

FIG. 6 shows an evaluation system 50 for measuring high-frequency characteristics of a thin-film transistor. A 2-port network analyzer 52 can be used. In this case, two ports are connected to a gate 56 and a drain 58 of a thin-film transistor 54, which is an object of measurement, via biases Tee 60 and 61, respectively. DC bias voltages V1 and V2 are applied to the gate 56 and drain 58 of the thin-film transistor via the biases Tee 60 and 61. With the signal frequency being varied, 4-terminal S parameters (S11, S12, S21, S22) of the thin-film transistor are measured. S11 is an input-side reflection coefficient, S12 is a reverse-directional gain, S21 is a forward-directional gain, and S22 is an output-side reflection coefficient. In general, S11 is better as the value of S11 is lower. S12 is a very low value. S21 is better as the value of S11 is higher, and S22 is better as the value of S22 is lower. A frequency higher than 900 MHz is chosen as the signal frequency.

The measured S parameters are converted to Y parameters, h parameters, etc. Important indices in evaluating the high-frequency performance of the thin-film transistor are a cutoff frequency ($f_T$) and a maximum oscillation frequency ($f_{max}$). The cutoff frequency ($f_T$) is defined as a frequency at which a current gain (h21) is 1. The maximum oscillation frequency ($f_{max}$) is defined as a frequency at which a maximum available power gain (MAG) or a Mason unilateral gain (U) is 1.

The maximum available power gain (MAG) is a power gain in a case where both the input side and output side of the device are impedance-matched. The Mason unilateral gain (U) is a power gain which is obtained when such a neutralizing circuit as to reduce a reverse-directional gain from the output to the input to zero is imaginarily provided and unilateralization is effected.

MAG is defined by $$MAG=|S_{21}/S_{12}|(K-(K^2-1)^{0.5})$$

where K is called "stabilizing coefficient" and K is defined by $$K=(1+|S_{11}S_{11}-S_{12}S_{21}|^2-|S_{11}|^2-|S_{22}|^2)/2|S_{12}S_{21}|.$$

U is given by $$U=(|S_{21}/S_{12}-1|^2/2)/(K|S_{21}/S_{12}|-Re(S_{21}/S_{12}))=MAG|S_{21}/S_{12}-1|^2/|S_{21}/S_{12}-MAG|^2.$$

As is understood from the above equations, when MAG=1, U=1. Thus, fmax can be obtained no matter which of MAG and U is used for evaluation.

Figure 7:
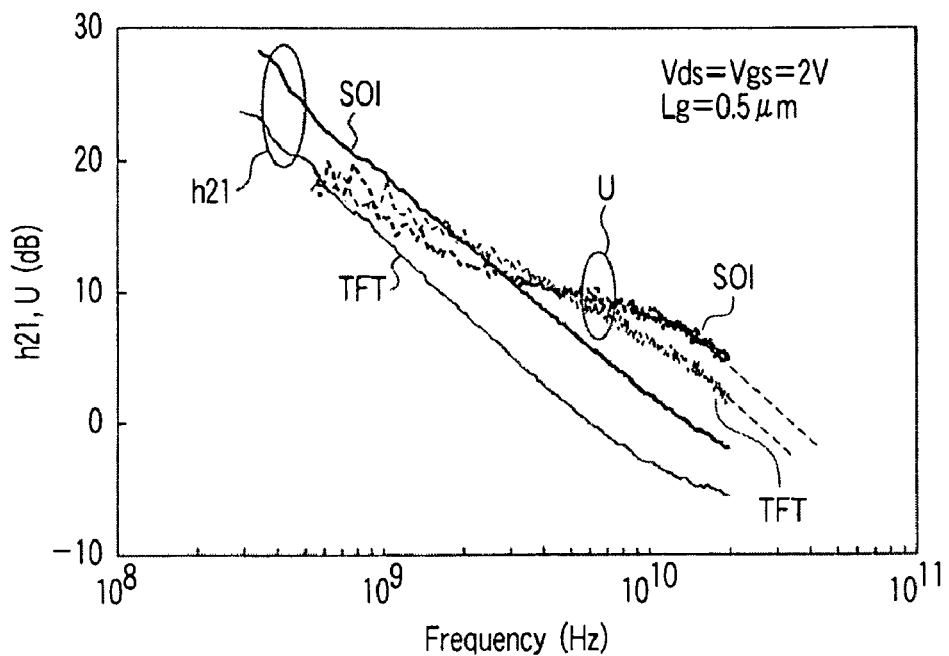
FIG. 7 is a graph showing frequency characteristics of a current gain (h21) and a unilateral gain (U) of an SOI thin-film transistor, which was formed for comparison with the thin-film transistor according to the present invention.

FIG. 7 shows frequency characteristics of the current gain (h21) and unilateral gain (U) of the thin-film transistor with a gate length of 0.5μ according to the present invention, in comparison with MOSFETs with the same gate dimensions on an SOI (Silicon On Insulator), which were fabricated for comparison. From the frequencies at which h21=0 (dB) and U=0 (dB), 6 GHz was obtained as the cutoff frequency of the thin-film transistor according to the present embodiment, and 15 GHz was obtained as the cutoff frequency of the SOI-MOSFETs. On the other hand, the maximum oscillation frequency of the thin-film transistor was about 25 GHz, and the maximum oscillation frequency of the SOI-MOSFETs was 35 GHz.

Figure 8A:
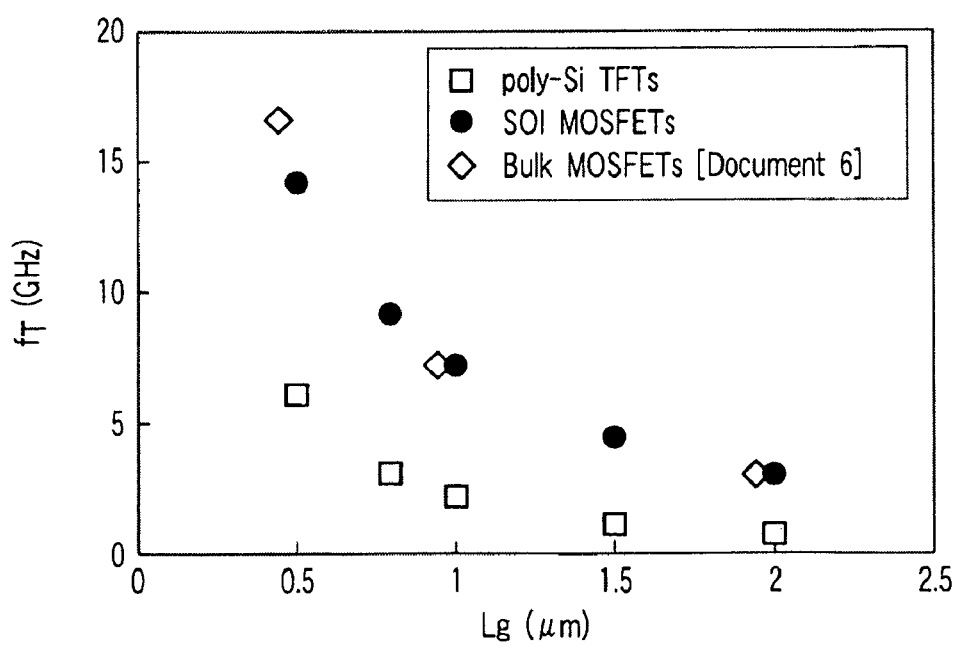
FIG. 8A is a graph showing the gate-length dependency of a cutoff frequency ($f_T$) of the thin-film transistor according to the present invention.
Figure 8B:
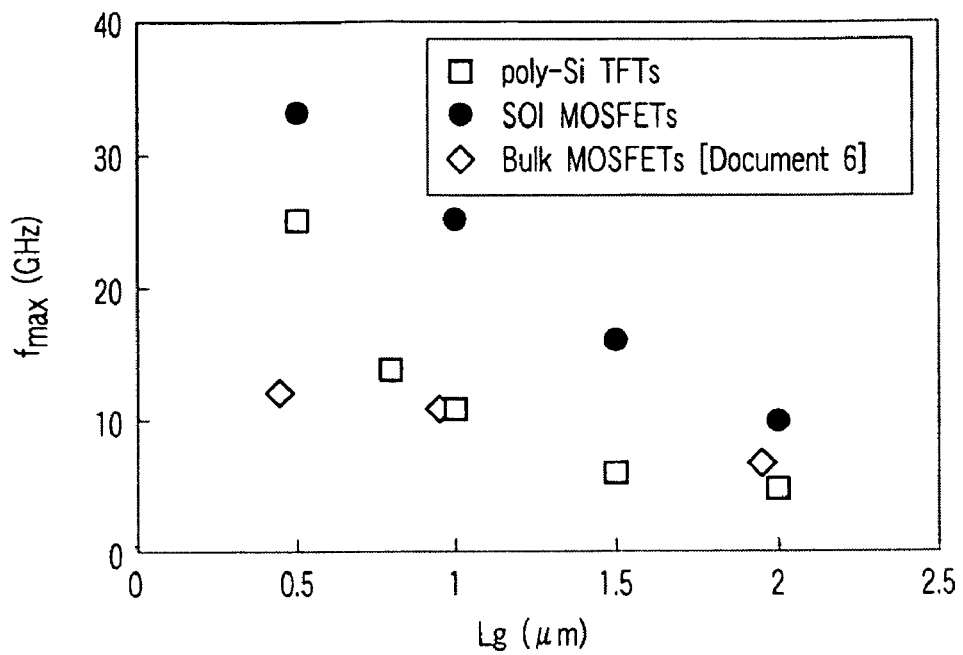
FIG. 8B is a graph showing the gate-length dependency of a maximum oscillation frequency ($f_{max}$) of the thin-film transistor according to the present invention.

FIG. 8A shows the gate-length dependency of the cutoff frequency ($f_T$) that was measured. FIG. 8B shows the gate-length dependency of the maximum oscillation frequency ($f_{max}$) that was measured. As the gate length decreases, both the cutoff frequency and the maximum oscillation frequency increase. In order to show the advantageous effect of the embodiment of the invention, FIG. 8A and FIG. 8B also show measured data (document 6) of bulk MOSFETs which were fabricated on the Si wafer.

The cutoff frequency of the thin-film transistor is lower than those of the SOI-MOSFETs and bulk MOSFETs. On the other hand, the SOI-MOSFETs and bulk MOSFETs have substantially equal cutoff frequencies. Since the cutoff frequency is given by the ratio between the mutual conductance gm and gate capacitance of the transistor, the difference in carrier mobility becomes a difference in cutoff frequency as such. The mobility of the thin-film transistor is about 300 (cm$^2$/Vs) at most, whereas the mobility of the SOI-MOSFETs or bulk MOSFETs is 600 to 700 (cm$^2$/Vs) and is great. Thereby, the difference in cutoff frequency between the thin-film transistor and other single-crystal devices is explained.

On the other hand, as regards the maximum oscillation frequency, the SOI-MOSFETs have high values. If the bulk MOSFETs and the thin-film transistor are compared, the thin-film transistor has a higher value although the thin-film transistor has a lower carrier mobility. The maximum oscillation frequency is influenced not only by the mutual conductance gm, but also by the parasitic capacitance of the drain, the parasitic inductance of the Si substrate and the resistance of the gate electrode. In the bulk MOSFETs, each of the parasitic capacitance and resistance component is high and restricts the maximum oscillation frequency. On the other hand, in the thin-film transistor, the mutual conductance gm is low. However, since the substrate is an insulator, the parasitic capacitance of the drain and the parasitic inductance of the substrate are very low. Besides, since the high-melting-point metal material (MoW) with low resistance is used for the gate electrode, a maximum oscillation frequency, which is higher than that of the bulk MOSFETs, was obtained.

Figure 9:
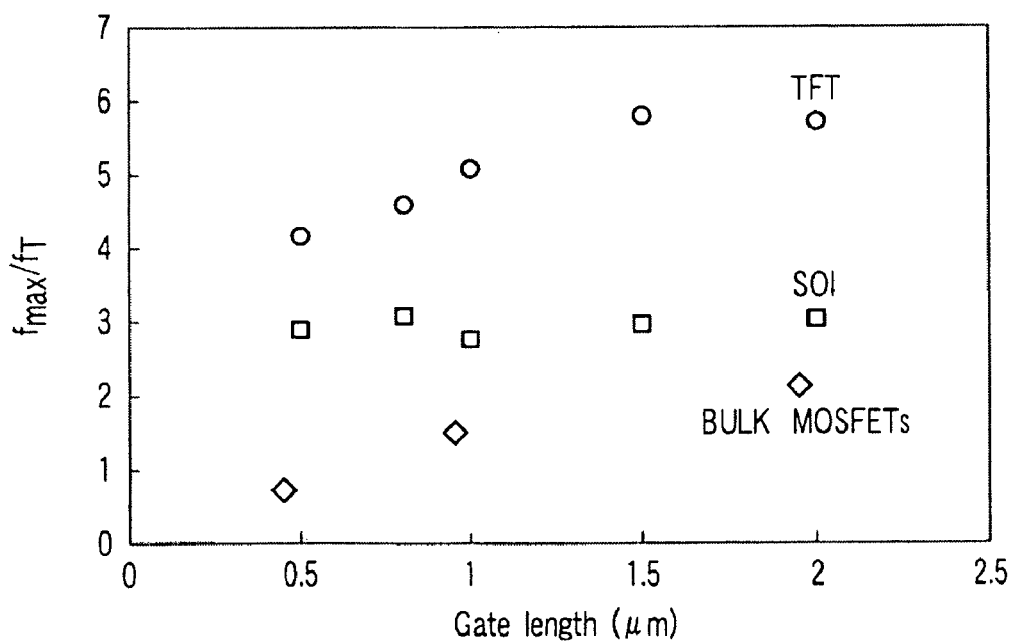
FIG. 9 is a graph plotting a ratio between the maximum oscillation frequency and the cutoff frequency in relation to the gate length.

FIG. 9 is a graph plotting the ratio of the maximum oscillation frequency to the cutoff frequency, in relation to the gate length with respect to the respective devices. In the SOI-MOSFETs and bulk MOSFETs, the ratio of the maximum oscillation frequency/cutoff frequency is about 3 or less. However, in the thin-film transistors on the glass substrate, this ratio is more than 4. In practice, it is important that the maximum oscillation frequency, which exhibits the performance with the inclusion of parasitic capacitance components and parasitic inductance components, is higher than the cutoff frequency that exhibits the performance of the channel. Thus, the thin-film transistor on the glass substrate is suited to high-frequency circuits.

This difference in high-frequency characteristics due to the material of the substrate also appears on the frequency characteristics of the admittance (Y) parameter.

Figure 10A:
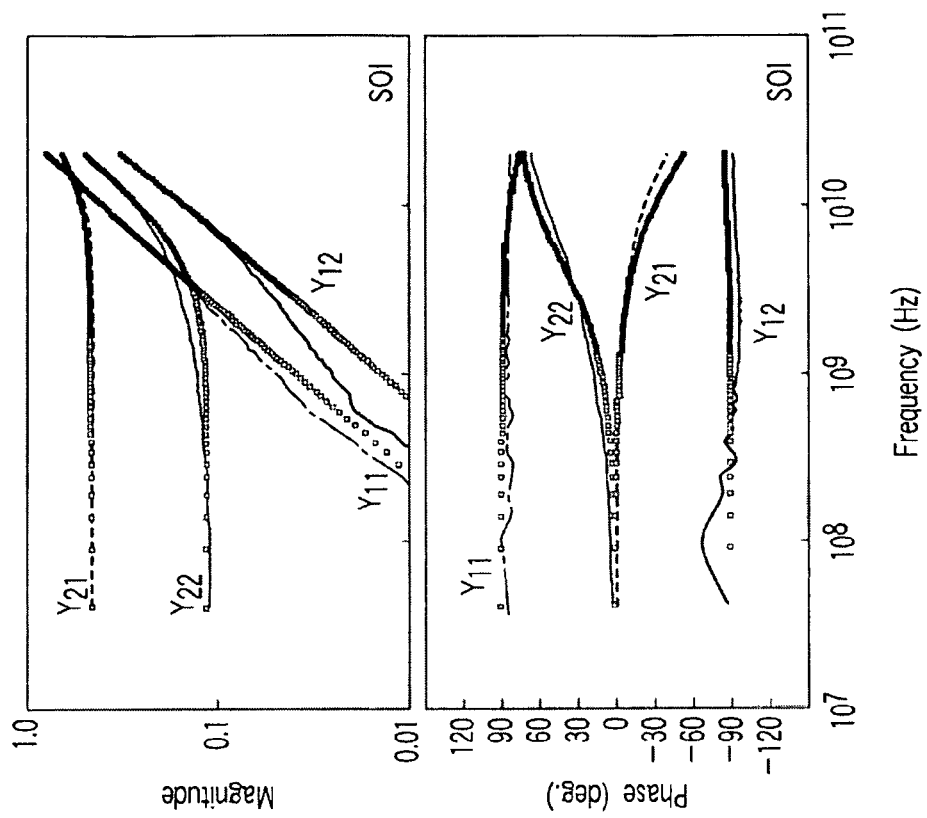
FIG. 10A is a graph in which an S parameter, which is measured with respect to a thin-film transistor on a glass substrate, is converted to a Y parameter, and the Y parameter is plotted in relation to frequencies.
Figure 10B:
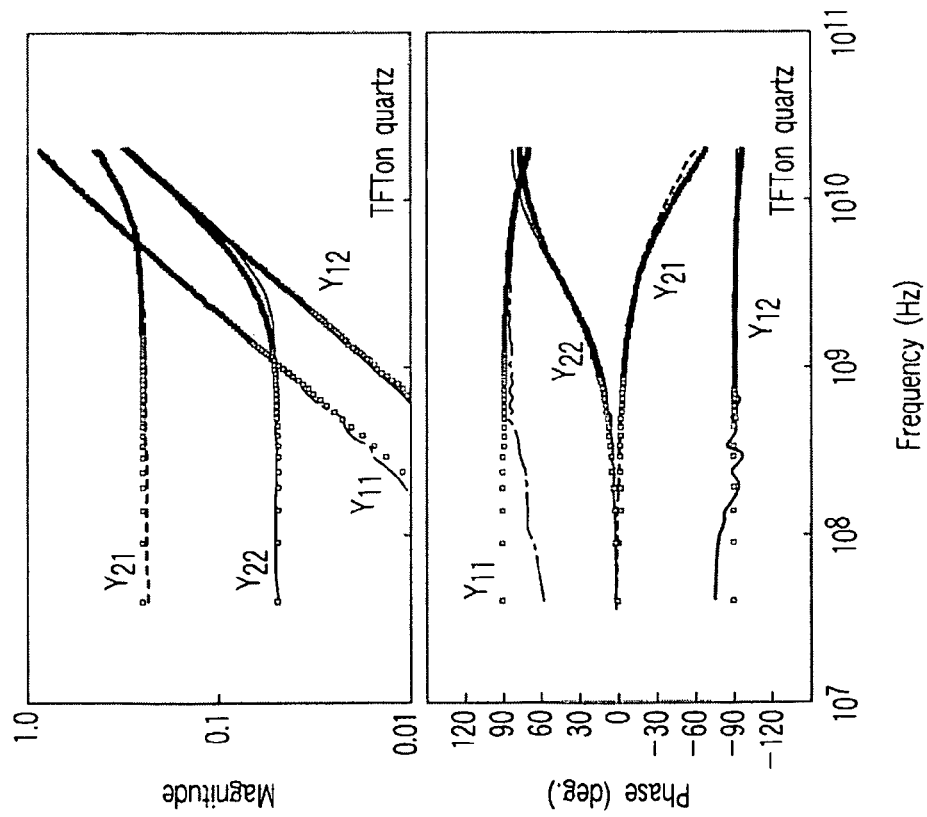
FIG. 10B is a graph in which an S parameter, which is measured with respect to an SOI-MOSFET, is converted to a Y parameter, and the Y parameter is plotted in relation to frequencies.

FIG. 10A and FIG. 10B are graphs plotting Y parameters, to which measured S parameters are converted, in relation to frequencies. An upper part of each Figure indicates absolute values of Y parameters, and a lower part of each Figure indicates phases. FIG. 10A shows a result relating to a thin-film transistor with a gate length of 0.5 μm on the glass substrate, and FIG. 10B shows a result relating to SOI-MOSFETs. In the Figures, solid lines indicate measured values, and symbol □ indicates calculated values which are computed according to equivalent circuit models shown in FIG. 11A and FIG. 11B.

Figure 11A:
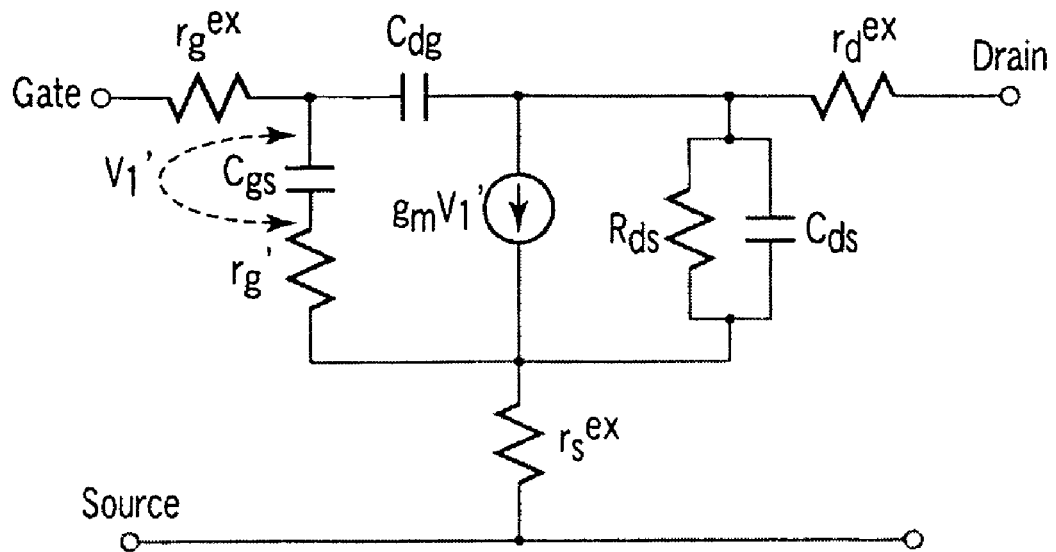
FIG. 11A shows a small-signal equivalent circuit model of a generally known MOSFET.

FIG. 11A shows a small-signal equivalent circuit model of a generally known MOSFET. In this model, the influence of parasitic components in the substrate is not included. The actual measurement values of the Y parameters of the thin-film transistor shown in FIG. 10A can substantially be reproduced by the simplest equivalent circuit model shown in FIG. 11A. This indicates that the parasitic components are negligibly small. On the other hand, the actual measurement values of the SOI-MOSFETs shown in FIG. 10B cannot easily be reproduced by the simplest equivalent circuit model as shown in FIG. 11A.

Figure 11B:
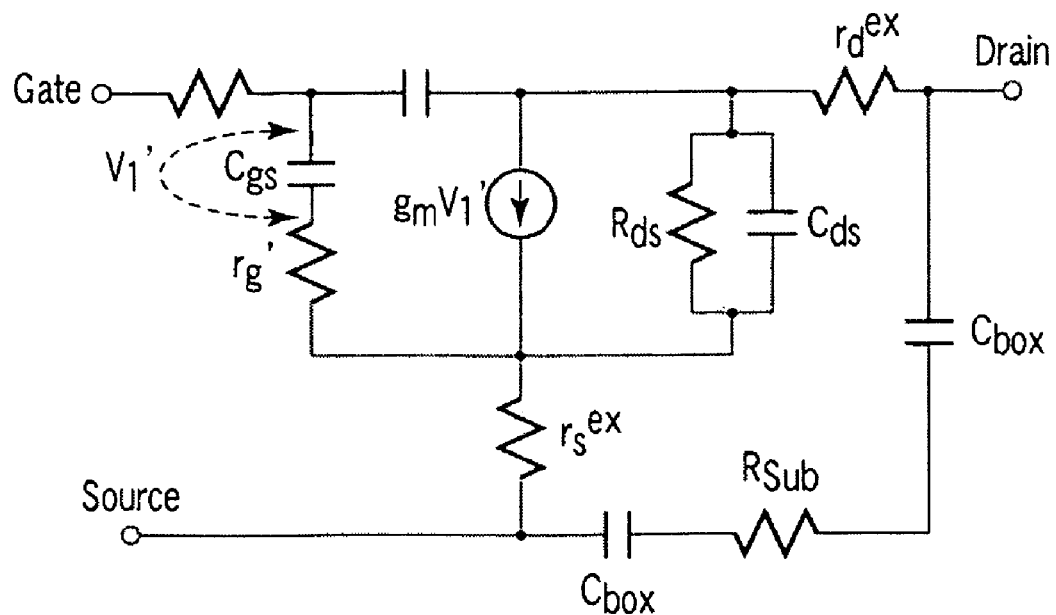
FIG. 11B is a model in which a finite substrate resistance $R_{sub}$ and a parasitic capacitance $C_{box}$ are added to the model shown in FIG. 11A.

FIG. 11B shows a model in which a finite substrate resistance Rsub and a parasitic capacitance Cbox via the substrate resistance Rsub are added to the model shown in FIG. 11A. By taking the parasitic capacitance into account, the actual measurement values of the SOI-MOSFETs can approximately be reproduced, as shown in FIG. 10B. However, a rising (hump) of Y11, Y12 in measurement values near 1 GHz cannot be reproduced even by the model of FIG. 11B. It is estimated that the hump is caused by the parasitic inductance due to eddy current flowing in the Si substrate.

By contrast, in the thin-film transistor on the glass substrate as in the embodiment of the present invention, since there is no such parasitic capacitance or parasitic inductance, a high maximum oscillation frequency can be obtained. In addition, that a device can be described by a simple equivalent circuit model contributes to an improvement in calculation precision in implementing circuit simulation. The design can greatly be simplified, and the number of design steps can be reduced.

Figure 12:
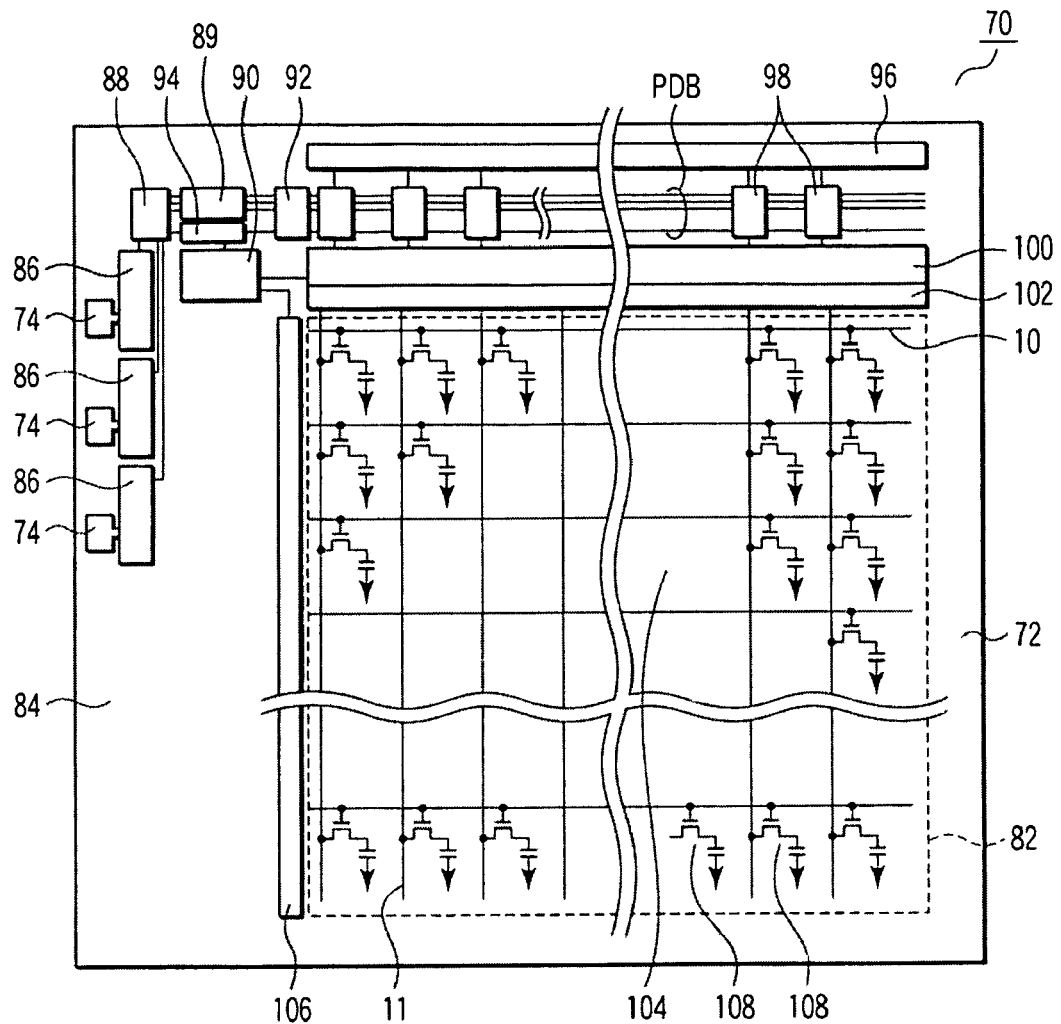
FIG. 12 shows the entire structure of a liquid crystal display device 70 according to the embodiment of the invention.

FIG. 12 shows the entire structure of a liquid crystal display device 70 according to an embodiment of the present invention. The entire structure of the display device, for example, the liquid crystal display device 70, includes an electromagnetic wave receiving circuit, a digital signal processing circuit and an active matrix. The electromagnetic wave receiving circuit comprises all or at least one of an amplifying circuit, a frequency mixing circuit and an oscillation circuit, which are constituted as integrated circuits by selectively integrating thin-film transistors which are formed in a semiconductor thin film that is formed on an insulating substrate and crystallized in a predetermined direction, an antenna which is formed by using a metal wiring film provided on the insulating substrate, inductors which are formed by using a metal wiring film, capacitors, and resistors. The digital signal processing circuit is constituted by using the thin-film transistors. The active matrix is composed of a plurality of thin-film transistors which are arrayed in a matrix, scanning lines and signal lines which connect the thin-film transistors, and pixel electrodes which are connected to the respective thin-film transistors.

In the present embodiment, image data is transferred by a non-contact transmission path of inductive-coupling 80, which is constituted by inductor elements 74 that are formed of an electrically conductive thin film such as a metal wiring film on a display substrate 72, and other inductor elements 78 that are formed of an electrically conductive thin film such as a metal wiring film on a board PCB 76 which constitutes a data transmission side system. Since the inductive-coupling circuit, which uses inductance, is employed as the non-contact transmission path, a high transmission rate can be secured at higher frequencies, and signal transmission with a low bit error rate can be realized.

Antennas formed of a metal wiring film, for example, inductors 74, are formed on an area 84 on the glass substrate, other than the area of the active matrix 82, as elements for receiving image data from outside. Amplifying circuits, for instance, signal amplifying circuits 86, and frequency mixing circuits (not shown) are connected to outputs of the inductors 74. Outputs of the signal amplifying circuits include not only video signals, but also clock signals Iclk, analog-digital conversion signals, control signals, etc. These outputs are adjusted to proper voltage levels via, for example, a level shift circuit 88 of the digital signal processing circuit, and then the video signal is converted to a parallel signal by a serial-parallel conversion circuit 89. In addition, the clock signal is frequency-divided by a frequency-division circuit 94 in accordance with the degree of parallel conversion, and the frequency-divided signal is delivered to a timing controller 90. The parallel-converted video signal, together with the frequency-divided clock signal, is delivered to a horizontal driver circuit 96 via a buffer memory 92. The video signal is latched by latch units 98 of the horizontal driver circuit at a proper timing, and is delivered to a DA conversion circuit 100 which is provided in association with each signal line. The DA conversion circuit 100 converts the video signal to an analog signal and supplies it to a display section 104 via a buffer 102. In the display section 104, a switch transistor 108, which is provided in each pixel, is turned off/off by a scanning signal that is supplied from a vertical scanning circuit 106, and the analog voltage from the horizontal driver circuit 96 is supplied to the liquid crystal layer via the scanning lines and signal lines, and an image is displayed.

The electromagnetic wave receiving circuit is constituted as integrated circuits by selectively integrating thin-film transistors provided on the glass substrate, inductors, capacitors, and resistors.

The electromagnetic wave receiving circuit comprises all or at least one of an amplifying circuit, a frequency mixing circuit and an oscillation circuit.

Figure 13:
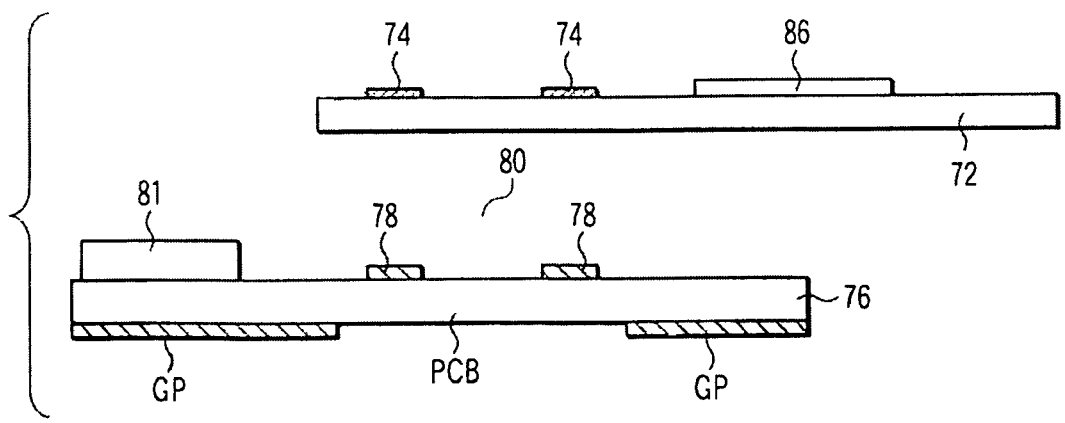
FIG. 13 is a schematic cross-sectional view of an inductive-coupling type non-contact transmission path which is formed by inductor elements on a display substrate and inductor elements on a data-transmission-side system.

FIG. 13 is a schematic cross-sectional view of an inductive-coupling type non-contact transmission path 80 which is constituted by the inductor elements 74 formed on the display substrate 72 and other inductor elements 78 formed on the board PCB 76 that constitutes a data-transmission-side system (not shown).

An image data transmission circuit 81 and inductors 78 with self-inductance L1 are formed on the system board PCB 76, and the inductors 78 are disposed substantially coaxial with the inductors 74 with self-inductance L2 that are formed on the display substrate 72. A signal voltage from the image data transmission circuit 81 is transmitted from the inductor elements 78 to the inductor elements 74 via a mutual inductance Lm therebetween, and the transmitted signal voltage is amplified by the thin-film transistors in the data processing circuit and stored in the memory. The inductance value of the inductor is selected at a value exceeding 20 nH.

Figure 14:
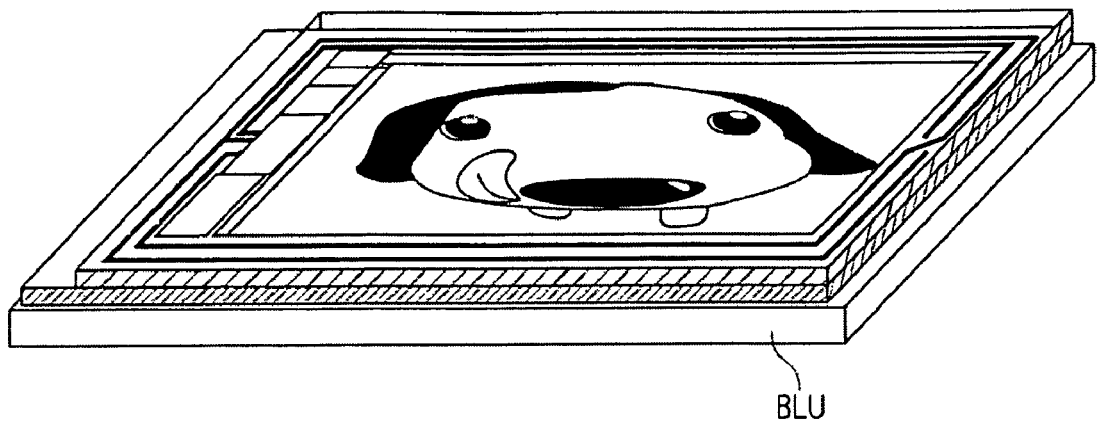
FIG. 14 is a bird's-eye view of the entirety of a liquid crystal display device.
Figure 15:
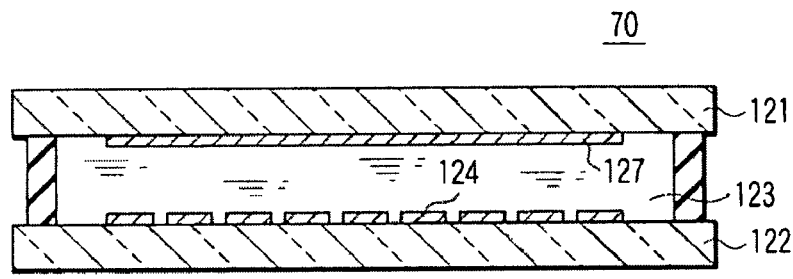
FIG. 15 is a cross-sectional view of the liquid crystal display device.

FIG. 14 is a bird's-eye view of the entire liquid crystal display device 70. FIG. 15 is a cross-sectional view of the liquid crystal display device 70. A liquid crystal material 123 is disposed between transparent insulating substrates 121 and 122. A plurality of pixel electrodes 124, which are driven by the active-matrix circuit shown in FIG. 12 and are arrayed in a matrix, are formed on the transparent insulating substrate 121. A counter-electrode 127 is disposed on the transparent insulating substrate 122. The potential of each pixel electrode 124 is controlled by the switch transistor 108 shown in FIG. 12. The optical characteristics of the liquid crystal material 123 are controlled by controlling the potential that is applied to the liquid crystal material 123 disposed between the counter-electrode 127 and the pixel electrodes 124.

Figure 16:
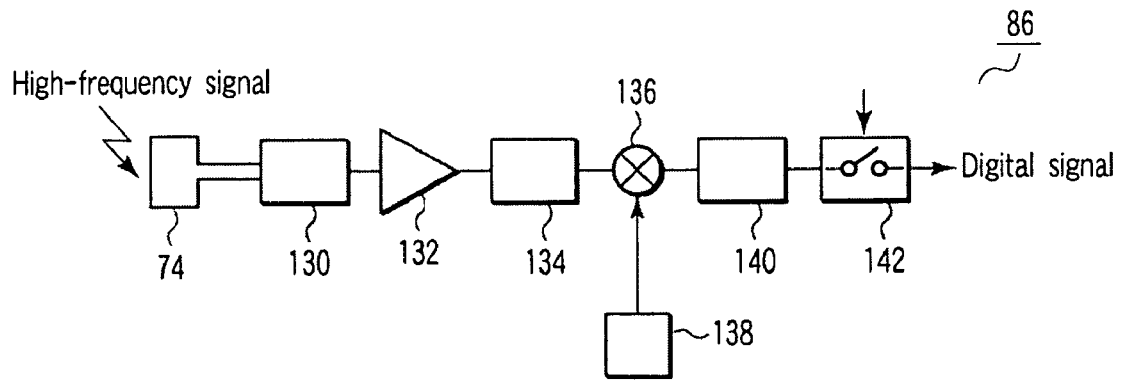
FIG. 16 is an example of a functional block diagram of a signal amplifying circuit shown in FIG. 12.

FIG. 16 shows an example of a functional block diagram of the signal amplifying circuit 86 shown in FIG. 12. A high-frequency signal (carrier frequency: 1.5 GHz) which is input to a reception coil 74 is a signal that is digitally modulated by a method such as FSK (Frequency Shift Keying) or PSK (Phase Shift Keying). The signal amplifying circuit 86 has a function of demodulating the signal and extracting the original digital signal.

A signal of a desired frequency is selected by the band-pass filter 130, and the signal is amplified by a low-noise amplifier (LNA) 132. The thin-film transistor with good high-frequency characteristics according to the present invention is an indispensable device for constituting the LNA. The output from the LNA 132 is passed through an image removal filter 134, and is then delivered to one input of a mixer 136. The other input of the mixer 136 receives a reference high-frequency signal from a local oscillator 138. A signal corresponding to a differential frequency from the output of the LNA 132 is input to a low-pass filter 140 and is then output from a sample & hold circuit 142 as a digital signal.

The above-described display device has the following features.

(1) Since the method of reception via the non-contact transmission path is adopted, signal lines for supplying signals to the electronic device and the display device are needless.

Thus, the portability of the device is enhanced, and the device becomes easier to use. In addition, since a flexible cable for supplying a signal in a small-sized electronic device is needless, the mounting of parts within the device becomes easier, and the degree of freedom of device design is advantageously increased.

(2) Since the inductive-coupling circuit, which uses inductance, is employed as the non-contact transmission path, a high transmission rate can be secured at higher frequencies, and signal transmission with a low bit error rate can be realized.

(3) Since the reception circuit is formed by using thin-film transistors, a special IC chip for high-frequency signal processing is needless and the device cost can be decreased. In addition, since high-performance thin-film transistors having a maximum oscillation frequency of 10 GHz or more are used, signals of higher frequencies can be amplified and therefore high frequencies can be used as carrier frequencies of the transmission path. Moreover, since the inductive-coupling circuit, which uses inductance, is employed, a high transmission rate can be secured at higher frequencies, and signal transmission with a low bit error rate can be realized. This means that the display device is adaptable to display with higher fineness.

(4) Since the inductor elements used in the reception circuit are formed integral with the thin-film transistors, the individual inductor elements are needless and the total cost can be reduced. In addition, since the inductors are integrated on the insulating substrate such as a glass or plastic substrate, the inductors with higher inductance values and low loss can be constituted. Therefore, the sensitivity of the reception circuit can be improved, the noise can be reduced and the performance can be enhanced.

Figure 17:
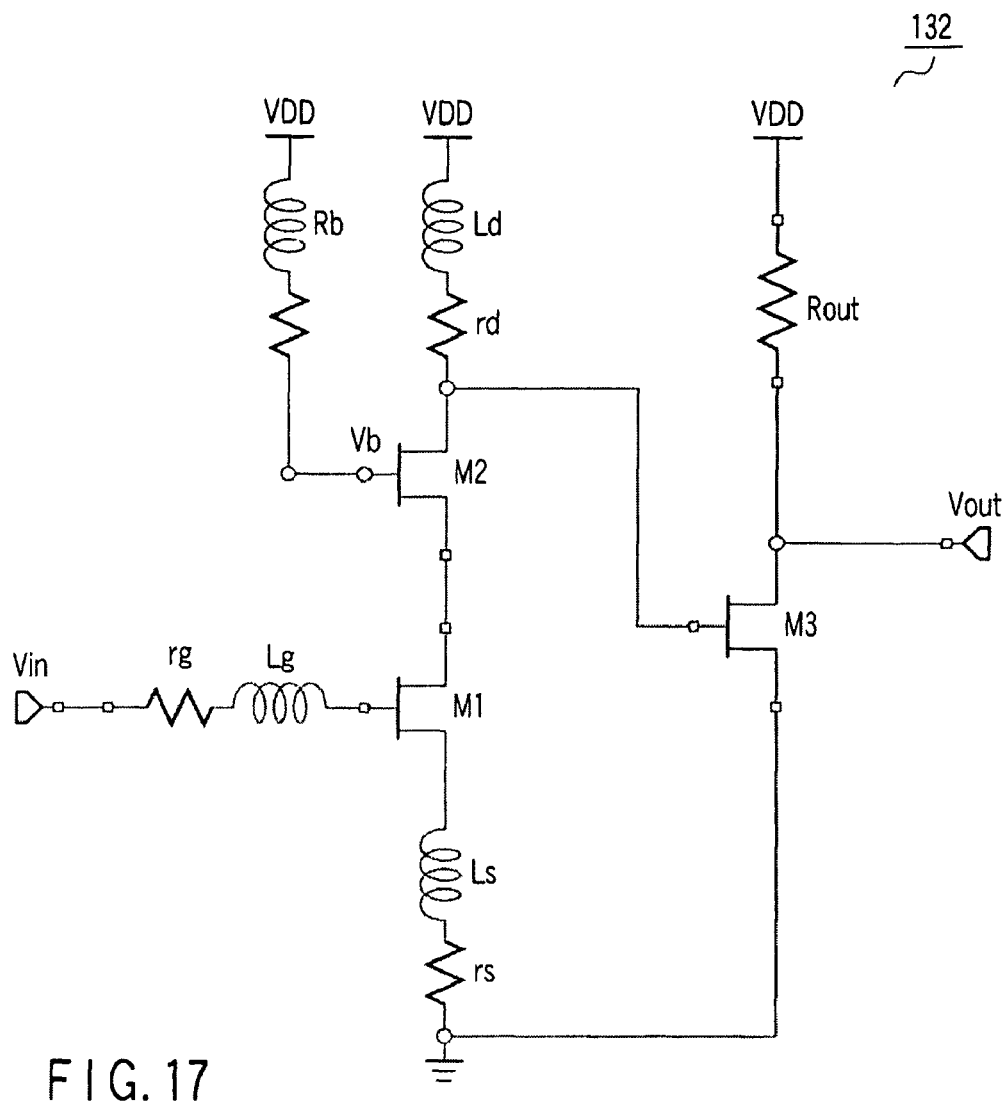
FIG. 17 is an example of a circuit diagram of a low-noise amplifier 132 shown in FIG. 16, which is composed of thin-film transistors according to the present invention.

FIG. 17 shows an example of a circuit diagram of the low-noise amplifier (LNA) 132 shown in FIG. 16, which is constituted by using the thin-film transistors according to the present invention. The first stage of the LNA 132 is a cascode amplifier which is composed of two N-type thin-film transistors M1 and M2. A high-frequency signal is input to the gate of the transistor M1. Inductors Lg and Ls are adjusted so as to set the input impedance of the transistor M1 at 50Ω at a desired frequency (1.5 GHz).

If the cutoff angular frequency of the transistor M1 is $\omega_T$, the input impedance of the transistor M1 becomes a pure real number at a resonance frequency $\omega o=1/\sqrt{LsCg}$ that is determined by the gate capacitance CG and Ls, and is given by $\omega_T Ls$. The value of Ls is determined so that the input impedance of the transistor M1 becomes 50Ω. In general, ωs does not accord with a desired frequency. Thus, the inductor Lg is added to the gate of the transistor M1. Since the resonance frequency $\omega o=1/\sqrt{(Ls+Lg)Cg}$, the value of Lg is determined so that this frequency becomes 1.5 GHz. This method is applicable when parasitic resistances rs and rg, which accompany Ls and Lg, are sufficiently low.

In the case where the inductors Ls and Lg are formed of metal thin films on the glass substrate, the parasitic resistances rs and rg reach several-tenΩ and are not ignorable. Thus, in fact, it is necessary to determine Ls so that $\omega_T Ls+rg$ may become close to 50Ω. The output of the first stage of the cascode structure is input to the gate of a transistor M3 that constitutes a source-grounded circuit of a simple resistance load. The load resistance is 50Ω, and the output impedance is about 50Ω. A drain inductor Ld constitutes a resonance circuit between itself and the gate capacitance of the transistor M3, and is adjusted to maximize the gain of the entire LNA at a desired frequency (1.5 GHz).

Table 1 shows the dimensions, mutual conductances gm and gate-source capacitances of the transistors M1 to M3. These transistors are formed by using Si thin films on the glass substrate, and their field-effect mobility is about 200 ($cm^2/Vs$).

TABLE 1

| | Channel length/Channel width | gm | Cgs |
|---|---|---|---|
| M1 | 0.5 μm/500μ | 0.198 Ms | 0.40 Pf |
| M2 | 0.5 μm/500μ | 0.198 Ms | 0.40 Pf |
| M3 | 0.5 μm/500μ | 0.198 Ms | 0.40 Pf |

Table 2 shows the constants of the respective components which are determined by the above-described procedure.

TABLE 2

| | |
|---|---|
| Lg | 28 nH |
| Ls | 0.7 nH |
| Ld | 25 nH |
| Rout | 50 Ω |
| Pb | 1000 Ω |
| rg | 22 Ω |
| rs | 0.5 Ω |
| rd | 19 Ω |

Figure 18:
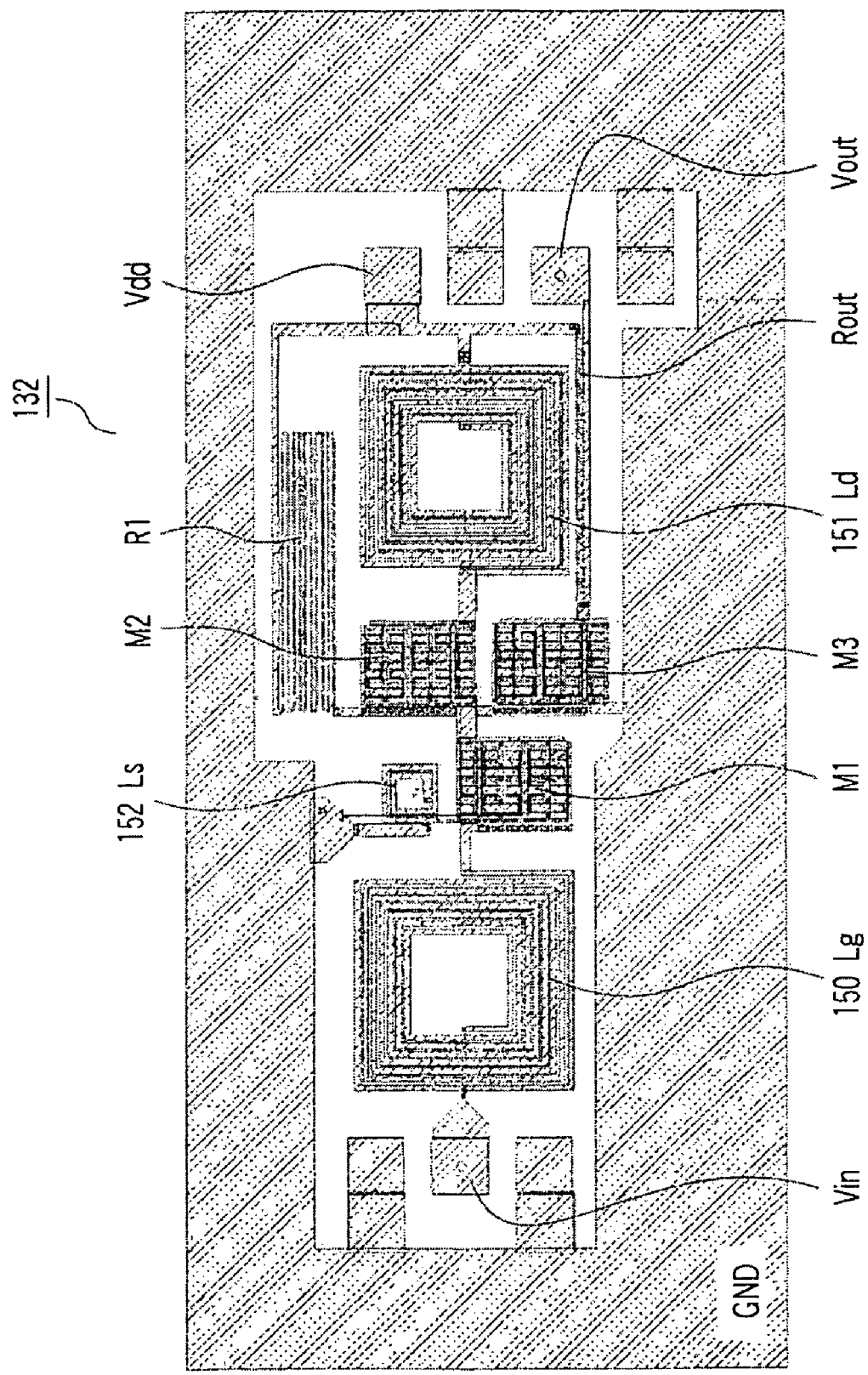
FIG. 18 is an example of a layout view of the entirety of the low-noise amplifier 132.

FIG. 18 shows an example of a layout view of the entirety of the LNA circuit 132. Spiral inductors Lg 150 and Ld 151 each having a 25 nH or more occupy large areas. In the prior art, external inductors have been used for the reason that the formation of large-area inductors is not desirable. However, the LNA circuit 132 of this embodiment, in particular, is formed by using the thin-film transistors and metal films on the glass substrate. Three spiral inductors Lg 150, Ld 151 and Ls 152 in FIG. 18 can be formed, for example, by using Al electrodes with a film thickness of 1μ, which are used for source and drain wiring of the thin-film transistors, and gate electrodes of MoW. With the adoption of this structure, the inductors can be formed in the same fabrication step as the thin-film transistors on the Insulating substrate. By forming the spiral inductors on the glass substrate, a higher inductance can be obtained, for example, compared to the case of forming spiral inductors on an SOI substrate. The reason is that there is no conductor (an Si substrate in the case of an SOI substrate) which forms capacitive coupling between the thin-film inductors 150, 151 and 152. The same advantageous effect can be obtained even with the use of other insulating substrates such as a quarts substrate and a plastic substrate.

Figure 19:
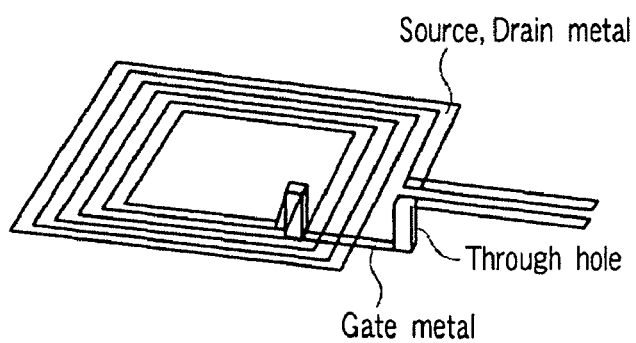
FIG. 19 is an example of a three-dimensional schematic view of a spiral inductor.

FIG. 19 is an example of a three-dimensional schematic view of the spiral inductor. This spiral conductor is configured such that MoW is used at an intersection of wiring lines. An Al thin film with a film thickness of 1μ was used, and thereby the parasitic resistance of the inductor was about 0.8 Ω/nH. The Q value of the inductor with such little substrate loss is given by ωoL/r. In the present embodiment, L=25 nH, r=22Ω, ωo=1.5 GHz, and the Q value is about 5.

To increase the Q value of the inductor leads directly to improvement of the gain of the LNA, and is very important. It is important that the Q value of the inductor is more than 4. In order to increase the Q value, it is necessary to decrease the parasitic resistance. For this purpose, the Al film thickness needs to be increased. In the present embodiment, however, the inductors are formed by directly using thin-film transistors which constitute the active matrix section or Al electrodes which are used for wiring. Thus, if the film thickness is increased with no consideration, a large stepped part occurs at the liquid crystal display section, and non-uniformity occurs when alignment films are subjected to rubbing treatment, leading to adverse effect on display performance.

Figure 20:
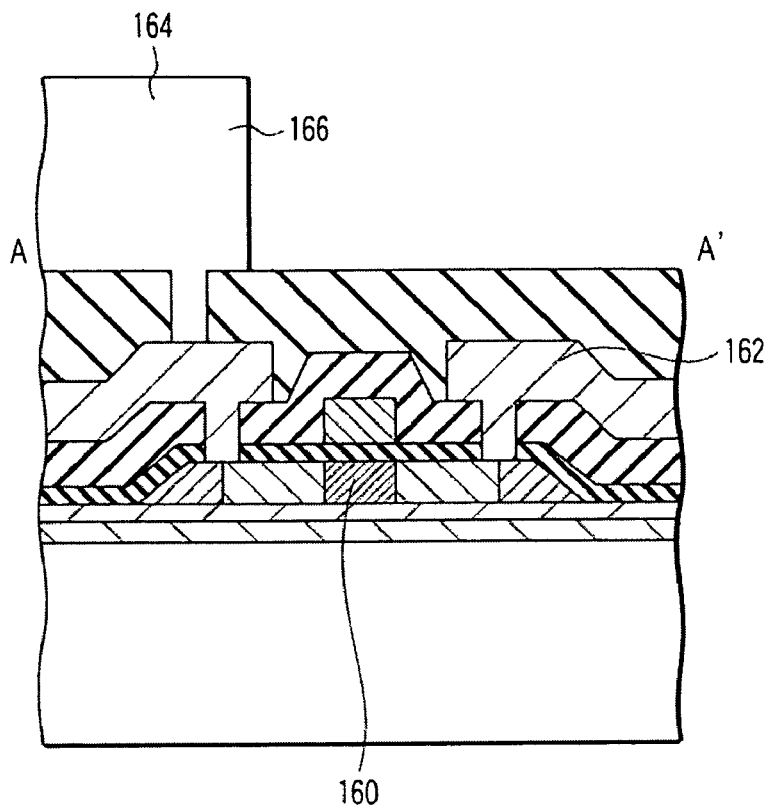
FIG. 20 shows an example in which an inductor is formed by providing another electrode layer on the layer of an Al electrode which is used for a thin-film transistor or wiring.

FIG. 20 shows a more preferable structure in consideration of the above. Specifically, it is thinkable to adopt a method of forming an inductor 166 by providing another electrode layer 164 over a thin-film transistor 160 of the active matrix section or an Al electrode 162 which is used for wiring. In this case, an inductor having a high Q value can be formed in the integrated circuit by forming a metal wiring film for inductor formation by means of plating or printing, with use of a material having a lower resistivity, such as Cu or Ag, which has a film thickness of about 5 to 10μ.

It is possible to form a resistor element by using a metal wiring. However, in a case where a high resistance is required, a metal thin film with a low electrical conductivity, such as nickel-chromium alloy, may additionally deposited and formed. In a case where a capacitor is used as a circuit structural component, a dielectric film between metal wiring films may be formed of an insulation film which is used for forming the thin-film transistor or, alternatively, a dielectric material, such as $SiO_2$, $TiO_2$ or $Al_2O_3$, may additionally be deposited and used.

Figure 21:
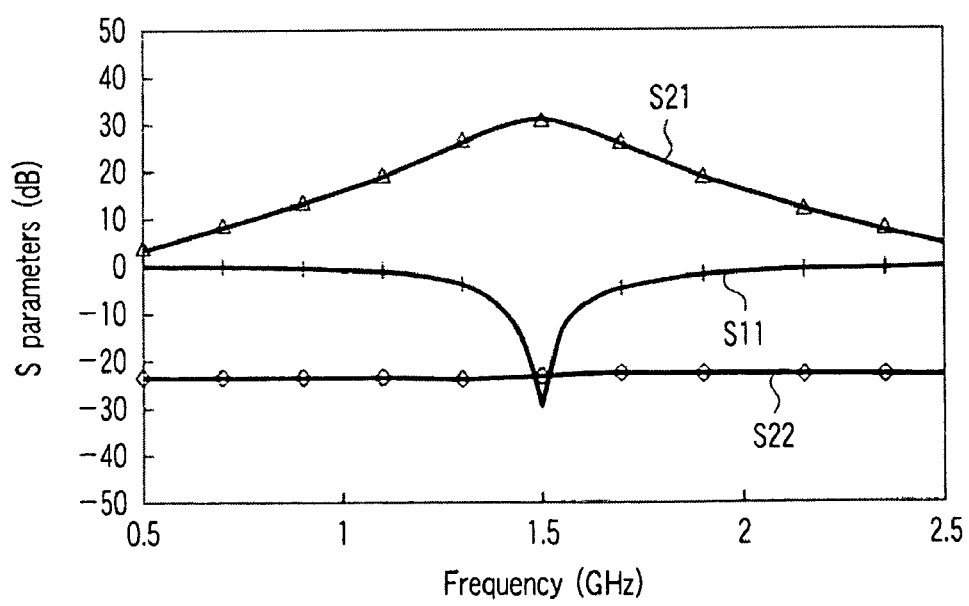
FIG. 21 is a graph showing transmission characteristics of the LNA (low-noise amplifier) 132 according to the embodiment of the invention.

FIG. 21 shows transmission characteristics of the LNA 132 according to the embodiment of the invention. A forward-directional gain (S21) of about 30 dB is obtained at 1.5 GHz. The reflection loss of input/output (S11, S22) is suppressed below −20 dB. Since the value of S12 is low, it is not shown.

FIG. 22 is a Smith chart representing reflection coefficients S11 and S22 of input/output. The center point in the chart is a matching point for 50Ω. S22 remains at the center and does not move. FIG. 22 shows that both S11 and S22 realize matching of 50Ω at 1.5 GHz. Input/output matching is established, and the reflection coefficient is low.

It is difficult to integrate large inductors of 25 nH or more, which are used in the present embodiment, on ordinary low-resistance Si substrates for CMOS and SOI substrates. The reason for this is that the loss due to the substrate is large and the Q value becomes very small, that the inter-substrate capacitance is large and the self-resonance frequency decreases, and that the function of the inductor cannot be exhibited at the frequency of 1.5 GHz. In the case where the LNA is composed of devices on the Si substrate, such large inductors are usually mounted as separate parts in the prior art. By contrast, the inductor that is formed on the insulating substrate is free from loss due to the underlying substrate. Thus, the large inductor of 25 nH or more can be formed in the same fabrication step as the thin-film transistor.

By forming high-performance thin-film transistors on a glass substrate, the integration with low-loss inductors can first be achieved, and a high-frequency circuit with good performance can be realized.

The present invention is suitably applicable to thin-film transistors formed on an insulating substrate, and to an electronic device and a display device using such thin-film transistors. In particular, the invention is suited to a display device which includes a wireless interface function using, e.g. inductive-coupling or capacitive-coupling.

What is claimed is:

1. A display device comprising:
   a thin-film transistor which is formed in a semiconductor thin film which is formed on an insulating substrate and crystallized in a predetermined direction;
   an antenna which is formed by using a metal wiring film provided on the insulating substrate;
   an electromagnetic wave receiving circuit which uses a plurality of the thin-film transistors and is formed of all or at least one of an amplifying circuit, a frequency mixing circuit and an oscillation circuit, which are constituted by selectively integrating an inductor which is formed by using a metal wiring film, and a resistor;
   a digital signal processing circuit which is constituted by using a plurality of the thin-film transistors;
   scanning lines and signal lines which connect a plurality of the thin-film transistors which are arrayed in a matrix; and
   an active matrix which is composed of pixel electrodes which are connected to the respective thin-film transistors.

2. A display device comprising:
   a thin-film transistor which is formed in a semiconductor thin film which is formed on an insulating substrate and crystallized in a predetermined direction;
   an inductor for forming an inductive-coupling circuit, which is formed by using an electrically conductive thin film provided on the insulating substrate;
   an electromagnetic wave receiving circuit which uses a plurality of the thin-film transistors and is formed of all or at least one of an amplifying circuit, a frequency mixing circuit and an oscillation circuit, which are constituted by selectively integrating an inductor which is formed by using a metal wiring film, and a resistor;
   a digital signal processing circuit which is constituted by using a plurality of the thin-film transistors; and
   an active matrix which is composed of a plurality of the thin-film transistors which are arrayed in a matrix, scanning lines and signal lines which connect the thin-film transistors, and pixel electrodes which are connected to the respective thin-film transistors.

3. The display device according to claim 1 or 2, wherein the thin-film transistors include a thin-film transistor having a cutoff frequency that is higher than 1 GHz.

4. The display device according to claim 1 or 2, wherein the thin-film transistors include a thin-film transistor having a maximum oscillation frequency that is higher than 10 GHz.

5. The display device according to claim 1 or 2, wherein the thin-film transistors include a thin-film transistor having a ratio of a maximum oscillation frequency to a cutoff frequency, which is greater than 4.

6. The display device according to claim 1 or 2, wherein a frequency of a reception electromagnetic signal is higher than 900 MHz.

7. The display device according to claim 1 or 2, wherein the inductor is an inductor having an inductance value which is higher than 20 nH, and having Q which is greater than 4.

8. The display device according to claim 1 or 2, wherein the metal wiring film of the inductor is formed at the same time as any one of electrodes of the thin-film transistor.

9. The display device according to claim 1 or 2, wherein the insulating substrate is a glass substrate or a plastic substrate.

* * * * *